(12) United States Patent
Sonoda

(10) Patent No.: US 9,257,923 B2
(45) Date of Patent: Feb. 9, 2016

(54) CONTROL SYSTEM FOR SYNCHRONOUS MOTOR INCLUDING ABNORMALITY DETECTION AND DIAGNOSIS FUNCTION

(71) Applicant: FANUC CORPORATION, Yamanashi (JP)

(72) Inventor: Naoto Sonoda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 43 days.

(21) Appl. No.: 14/210,396

(22) Filed: Mar. 13, 2014

(65) Prior Publication Data

US 2014/0265960 A1    Sep. 18, 2014

(30) Foreign Application Priority Data

Mar. 14, 2013  (JP) .................................. 2013-052020

(51) Int. Cl.
| | |
|---|---|
| *H02P 1/46* | (2006.01) |
| *H02P 6/12* | (2006.01) |
| *H02P 29/02* | (2006.01) |
| *H02P 6/16* | (2006.01) |
| *G01R 31/34* | (2006.01) |

(52) U.S. Cl.
CPC ................ *H02P 6/12* (2013.01); *G01R 31/343* (2013.01); *H02P 6/165* (2013.01); *H02P 29/021* (2013.01)

(58) Field of Classification Search
CPC .................. H02P 2005/401; H02P 2005/4012; H02P 2006/045; H02P 6/16; H02P 2007/6204; H02P 21/0035; H02P 2205/01

USPC ................................ 318/700, 400.01, 400.02
See application file for complete search history.

(56) References Cited

U.S. PATENT DOCUMENTS

| | | | |
|---|---|---|---|
| 5,825,150 A | 10/1998 | Kachi et al. | |
| 6,445,154 B1* | 9/2002 | Toyozawa et al. | ............ 318/700 |
| 2002/0008492 A1* | 1/2002 | Nagayama | .................... 318/727 |
| 2002/0097018 A1 | 7/2002 | Nagata et al. | |
| 2004/0085087 A1 | 5/2004 | Zehentner et al. | |
| 2005/0212548 A1 | 9/2005 | Kim et al. | |
| 2008/0297078 A1* | 12/2008 | Iwasaki et al. | ........... 318/400.02 |
| 2009/0309531 A1* | 12/2009 | Hamahata | .................... 318/565 |

FOREIGN PATENT DOCUMENTS

| | | |
|---|---|---|
| CN | 1353499 A | 6/2002 |
| CN | 1674431 A | 9/2005 |
| CN | 1825730 A | 8/2006 |
| DE | 19607688 A1 | 1/1997 |

(Continued)

*Primary Examiner* — Eduardo Colon Santana
*Assistant Examiner* — Bickey Dhakal
(74) *Attorney, Agent, or Firm* — Hauptman Ham, LLP

(57) ABSTRACT

A control system includes a current control unit providing, in accordance with the magnetic pole position of a rotor in which permanent magnets are disposed, a first current command to a first excitation phase of a stator winding and providing a second current command to a second excitation phase, a current error calculator calculating a current error which is a difference between a current flowing through the motor during the first period and the first current command or a difference between a current flowing through the motor during the second period and the second current command, and an abnormality detection and diagnosis unit detecting an abnormality based on the speed, the direction of movement and the amount of movement of the motor and the magnitude of the current error.

6 Claims, 6 Drawing Sheets

(56) References Cited

FOREIGN PATENT DOCUMENTS

| | | |
|---|---|---|
| DE | 10120721 A1 | 5/2002 |
| DE | 102005007869 A1 | 10/2005 |
| JP | 2001-078487 A | 3/2001 |
| JP | 2004-072997 A | 3/2004 |
| JP | 2005-237199 A | 9/2005 |
| JP | 2005-312090 A | 11/2005 |
| JP | 2006-238688 A | 9/2006 |
| JP | 2008-161021 A | 7/2008 |
| JP | 2010-041830 A | 2/2010 |
| JP | 2010-183698 A | 8/2010 |
| WO | 2013/002251 A1 | 1/2013 |

* cited by examiner

CONTROL SYSTEM FOR SYNCHRONOUS MOTOR INCLUDING ABNORMALITY DETECTION AND DIAGNOSIS FUNCTION

CROSS-REFERENCE TO RELATED APPLICATIONS

This application is a new U.S. patent application that claims benefit of JP 2013-052020, filed on Mar. 14, 2013, the content of JP 2013-052020 is incorporated herein by reference.

FIELD OF THE INVENTION

The present invention relates to a control system for a synchronous motor and, in particular, to a control system for a synchronous motor that includes an abnormality detection and diagnosis function.

BACKGROUND OF THE INVENTION

In the field of synchronous motors, a synchronous motor is controlled to pass a current in an appropriate excitation phase of a stator winding in accordance with a magnetic pole position of a rotor in which permanent magnets are disposed, thereby producing a desired torque. One known way to detect a magnetic pole position of the rotor is to use a magnetic pole sensor or the like designed for that purpose. Typically, an angle sensor for absolute angular measurement is used. To attach the angle sensor, a "magnetic pole alignment operation" needs to be performed in which a reference position of the angle sensor is aligned with a magnetic pole position of the rotor.

In the case of an ordinary motor with an angle sensor, the magnetic pole alignment of the angle sensor is carried out in a manufacturing process by the manufacturer. However, in the case of a motor for a machine or an apparatus (a built-in motor), parts, including a rotor, a stator and a sensor, are provided to a user and the user needs to carry out the magnetic pole alignment operation when incorporating the motor into a machine or the like.

In order to facilitate the magnetic pole alignment operation performed by the user, most controllers for synchronous motors include a function for detecting a magnetic pole position and various methods for the function have been proposed (for example, refer to Japanese Unexamined Patent Publications No. JP-A-2001-78487). JP-A-2001-78487 discloses a method for detecting a magnetic pole position of a rotor, including the steps of (1) applying a current to a predetermined excitation phase of a stator, (2) obtaining a direction of movement of a rotor caused by the application of the current, (3) estimating a magnetic pole position of the rotor on the basis of the obtained direction of movement, (4) identifying, on the basis of the estimated magnetic pole position of the rotor, a predetermined excitation phase to which a current is to be applied next, and (5) repeating the steps (1) to (4).

The conventional technique requires information such as the number of poles of the synchronous motor, the resolution of the angle sensor, and the direction of rotation of the synchronous motor and the angle sensor beforehand and cannot accurately detect the magnetic pole position if these items of information are not available. Furthermore, if there is an incorrect connection between an amplifier which supplies electric power to the motor and a power line of the motor, i.e., connection of power lines in an incorrect phase sequence in the case of a three-phase synchronous motor, or a poor connection, or if there is significant noise in a signal fed back to the controller, for example a feedback signal of a current flowing through a power line or a feedback signal of the angle sensor, the magnetic pole position is difficult to accurately detect. Moreover, in a method for detecting the magnetic pole position while the motor is operating as in the conventional magnetic pole position detection method, friction and inertia in a machine can affect the detection of magnetic pole position and thereby reduce the accuracy of the detection.

When the magnetic pole position is difficult to accurately detect as described above, it may be necessary to analyze causes of the abnormality and notify the user of a likely cause. Notifying the user of an abnormality allows the user to quickly take a corrective action and facilitates quick initial start-up of the motor. Moreover, the notification can also prevent damage to the machine which would otherwise be caused by an unexpected motion due to activation of the motor based on a false detection.

A controller capable of detecting an abnormality such as a false detection of a magnetic pole position is known (for example, refer to Japanese Unexamined Patent Publications No. JP-A-2005-237199). This existing controller uses a sensorless control method to estimate a magnetic pole position from the value of a current flowing through the motor and can detect an abnormal estimated magnetic pole position from electric power obtained by two computational operation means.

However, the existing motor controllers are unable to detect an abnormality during the initial start-up of the motor. Another problem with the existing motor controllers is the inability to detect an abnormality due to a fault such as an incorrect connection of a power line of the motor or an incorrect setting of a parameter such as the number of poles of the motor.

SUMMARY OF THE INVENTION

A control system according to an embodiment of the present invention is a control system for a synchronous motor with an abnormality detection and diagnosis function. The control system includes a current control unit providing, in accordance with a magnetic pole position of a rotor of the motor in which permanent magnets are disposed, a first current command to a first excitation phase of a stator winding of the motor over a first period of time when the motor is to be stopped and providing a second current command to a second excitation phase different from the first excitation phase over a second period of time when the motor is to be caused to operate, a current error calculator calculating a current error which is a difference between a current flowing through the motor in the first period of time and the first current command or a difference between a current flowing through the motor in the second period of time and the second current command, and an abnormality detection and diagnosis unit detecting an abnormality on the basis of at least one of the speed, the direction of movement and the amount of movement of the motor and the magnitude of the current error in each of the first period of time and the second period of time.

The control system according to the other embodiment of the present invention is capable of detecting an abnormality during an initial start-up of a motor and is capable of detecting an abnormality due to a fault such as an incorrect connection of a power line of the motor or an incorrect setting of a parameter such as the number of poles of the motor.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

A control system according to an embodiment of the present invention will be described below with reference to drawings. It should be noted that the technical scope of the present invention is not limited to the embodiments described herein but encompasses the invention defined in the claims and equivalents thereof.

Figure 1:
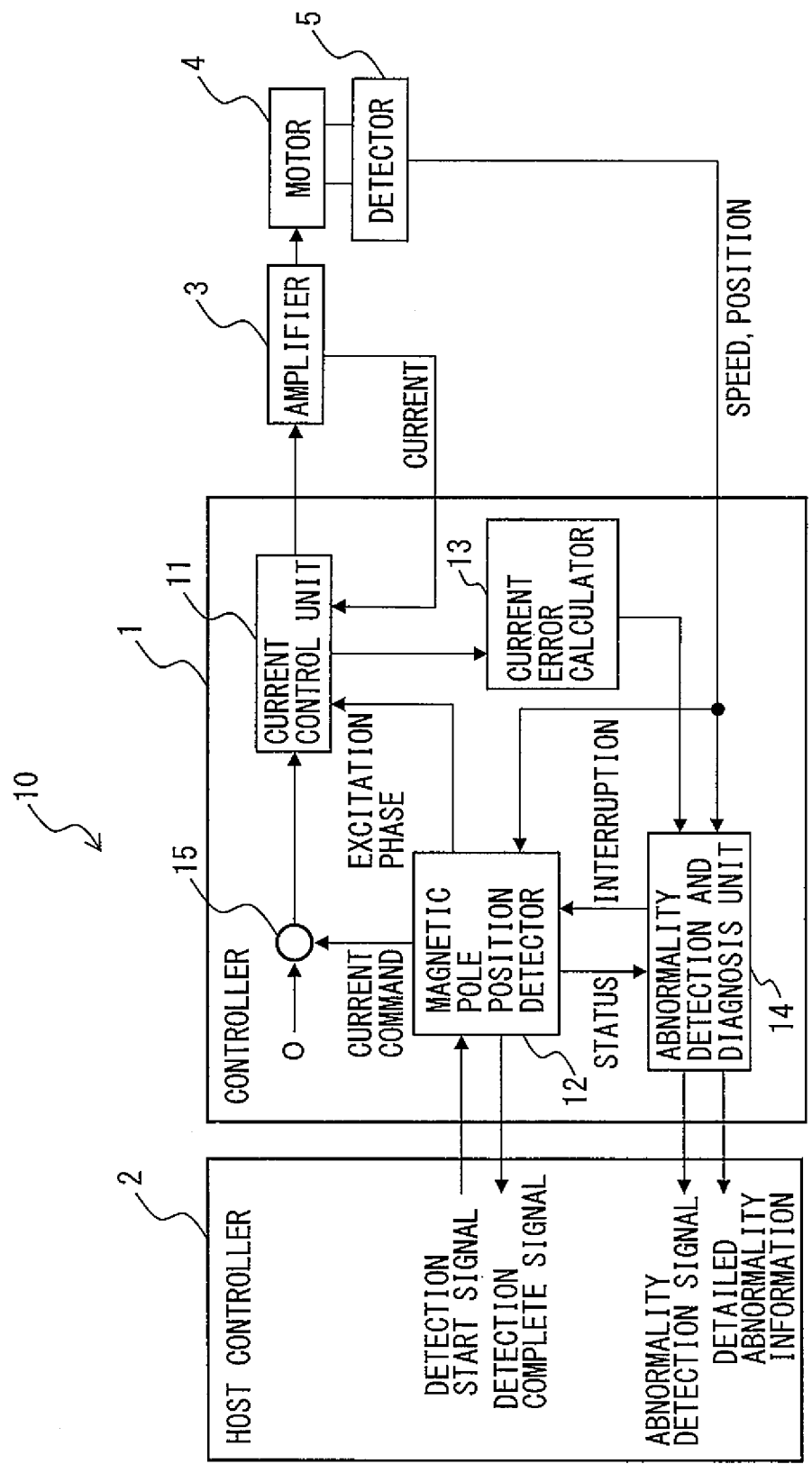
FIG. 1 is a configuration diagram of a control system of an embodiment of the present invention.

FIG. 1 is a configuration diagram of a control system for a motor according to an embodiment of the present invention. The control system 10 of an embodiment of the present invention includes a controller 1 for controlling operations of the motor 4 and a host controller 2 which provides an abnormality detection start command to the controller 1. The controller 1 includes a current control unit 11, a magnetic pole position detector 12, a current error calculator 13 and an abnormality detection and diagnosis unit 14.

In accordance with the magnetic pole position of a rotor of the motor 4 in which permanent magnets are disposed, the current control unit 11 provides a first current command to a first excitation phase of a stator winding of the motor 4 over a first period of time when the motor 4 is to be stopped. The current control unit 11 provides a second current command to a second excitation phase different from the first excitation phase over a second period of time when the motor 4 is to be caused to operate. The first current command and the second current command from the current control unit 11 to the motor 4 are provided through an adder 15 in accordance with a current command from the magnetic pole position detector 12.

The magnetic pole position detector 12 corrects an excitation phase on the basis of the magnetic pole position of the motor 4 stopped.

The current error calculator 13 calculates a current error which is a difference between a current flowing through the motor 4 during the first period of time and the first current command or a difference between a current flowing through the motor 4 during the second period of time and the second current command.

The abnormality detection and diagnosis unit 14 detects an abnormality on the basis of at least one of the speed, the direction of movement and the amount of movement of the motor 4 and the magnitude of a current error in the first and second periods of time.

The host controller 2 provides a detection start signal to the magnetic pole position detector 12 provided in the controller 1 to cause the magnetic pole position detector 12 to start detection of a magnetic pole position of the motor 4. When the controller 1 completes detection of the magnetic pole position of the motor 4, the magnetic pole position detector 12 sends a detection complete signal to the host controller 2.

When the controller 1 detects an abnormality in detection of the magnetic pole position of the motor 4 as will be described later, the abnormality detection and diagnosis unit 14 sends an abnormality detection signal and detailed abnormality information to the host controller 2.

The current control unit 11 sends a voltage command to an amplifier 3 and a current controlled by the amplifier 3 is provided to the motor 4. The current provided to the motor 4 is fed back to the current control unit 11 from the amplifier 3.

A detector 5 for detecting the speed and position of a rotor (not shown) of the motor 4 is provided near the rotor and rotor speed data and rotor position data are fed back to the abnormality detection and diagnosis unit 14.

Methods for using the control system of an embodiment of the present invention to detect an abnormality in the detection of the magnetic pole position of the motor will now be described. Abnormalities detected by the control system of an embodiment of the present invention include first to seventh abnormalities. Methods for detecting these individual abnormalities will be described.

<Method for Detecting First Abnormality>

According to an embodiment of the present invention, "the amount of declination" of the d-axis from the actual magnetic pole position (the direction of magnetic flux) in the dq coordinate system calculated from an angle sensor is detected and is used to correct an excitation phase. Diagnosis is made in this state as to whether there is an abnormality in the magnetic pole position detection and the result of the diagnosis is provided to a user through the host controller such as a CNC (Computerized Numerical Control) system.

First, a method for detecting a first abnormality in the detection of a magnetic pole position of the motor by the control system of an embodiment of the present invention will be described. The first abnormality is detected on the basis of whether or not the motor properly stops in response to a command to stop the motor. By detecting whether there is the first abnormality, it can be detected whether there is an abnormality in response to the stop command in an early stage of operation of the motor.

Figure 2:
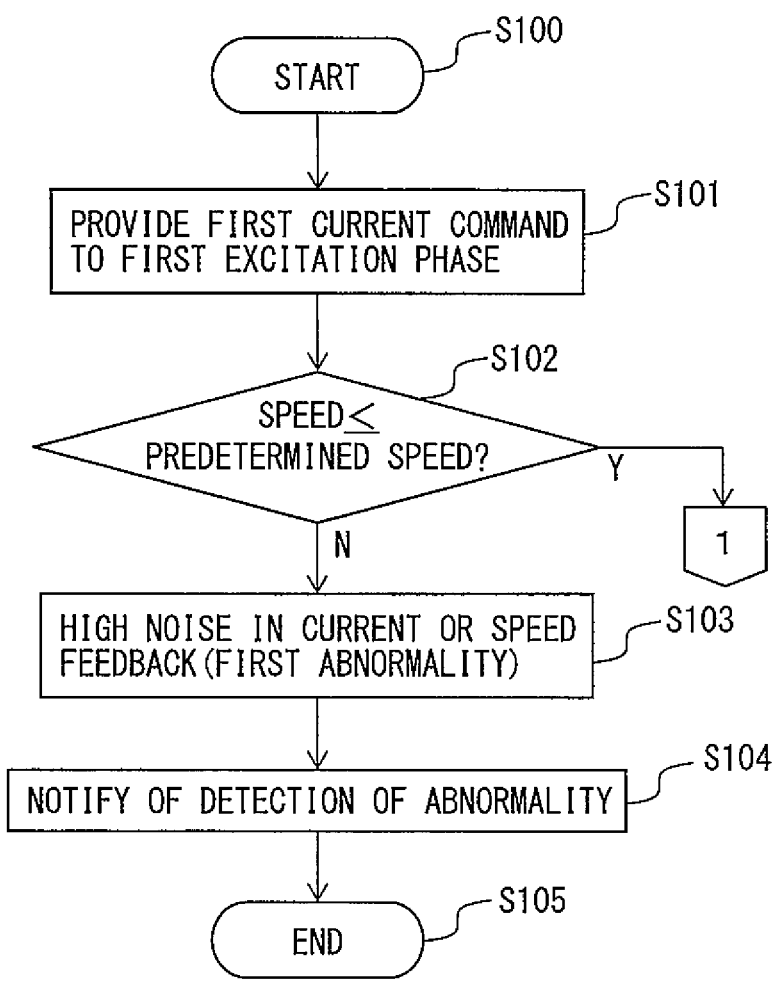
FIG. 2 is a flowchart illustrating a procedure for detecting a first abnormality by the control system of an embodiment of the present invention.

FIG. 2 is a flowchart for illustrating a procedure for detecting the first abnormality in the motor by the control system of an embodiment of the present invention. First, at step S101, in order to stop the motor 4, the current control unit 11 provides a first current command to a first excitation phase of the stator winding of the motor 4 over a first period of time in accordance with the magnetic pole position of the rotor of the motor 4 in which permanent magnets are disposed. This enables a constant current to be applied to a predetermined excitation phase on the dq axes (for example, 0 degrees corresponds to q axis).

Then, at step S102, the abnormality detection and diagnosis unit 14 determines whether the speed of the motor 4 has decreased to a predetermined speed or lower in order to check whether the motor 4 is in a stop state. When the speed is not lower than or equal to the predetermined speed, it is judged at step S103 that an abnormality (the first abnormality) such as high noise in a current feedback from the motor 4 to the current control unit 11 or in a speed feedback from the motor 4 to the abnormality detection and diagnosis unit 14 has occurred.

Then, at step S104, the abnormality detection and diagnosis unit 14 sends an abnormality detection signal to the host controller 2 to notify the host controller 2 of the occurrence of the first abnormality. Note that the abnormality detection and diagnosis unit 14 may send detailed abnormality information about the first abnormality to the host controller 2.

When the abnormality detection and diagnosis unit 14 determines at step S102 that the speed of the motor 4 is lower than or equal to the predetermined speed, the abnormality detection and diagnosis unit 14 continues to determine whether or not there is another abnormality, as will be described later.

By detecting the first abnormality on the basis of the fact that the motor has not stopped in spite of the control for causing the motor to stop as described above, it can be detected whether there is an abnormality in response to the stop command in the initial operation of the motor.

<Method for Detecting Second and Third Abnormalities>

A method for detecting second and third abnormalities in the motor by the control system of an embodiment of the present invention will now be described. The second and third abnormalities are detected on the basis of whether or not the motor properly operates in response to a command to drive the motor to a desired position after making sure that the motor properly stops. By detecting whether or not there is the second or third abnormality, it can be detected whether there is an abnormality in response to the operation command in an early stage of operation of the motor.

Figure 3:
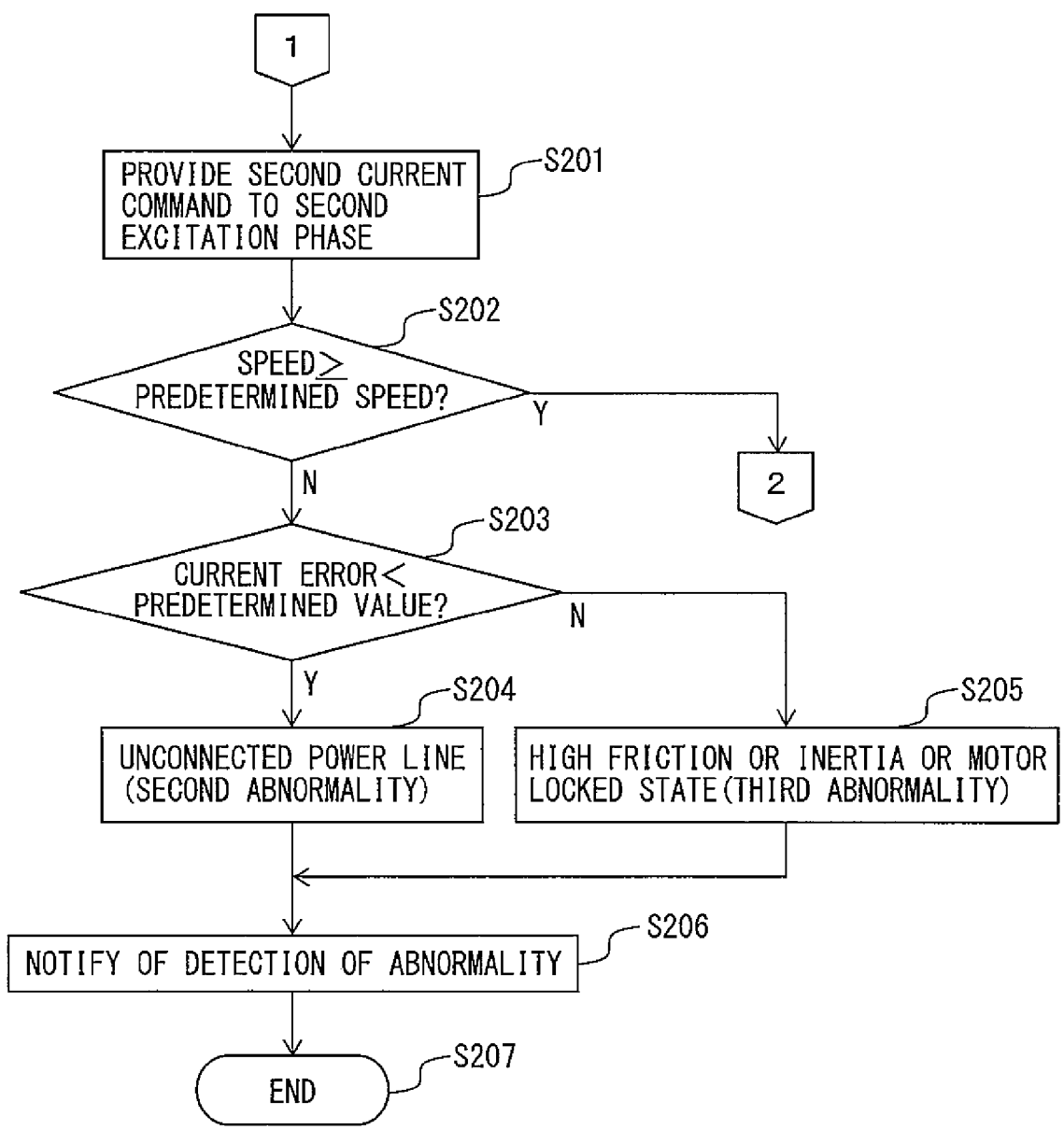
FIG. 3 is a flowchart illustrating a procedure for detecting second and third abnormalities by the control system of an embodiment of the present invention.

FIG. 3 is a flowchart illustrating a procedure for detecting second and third abnormalities in the motor by the control system of an embodiment of the present invention. First, at step S201, the current control unit 11 provides a second current command to a second excitation phase of the motor 4 over a second period of time. The second excitation phase is different from the first excitation phase (90 degrees, for example).

Then, at step S202, in order to make sure that the motor 4 is operating (not in a stop state), the abnormality detection and diagnosis unit 14 determines whether or not the speed of the motor has increased to a predetermined speed or higher. When the speed is not higher than or equal to the predetermined speed, determination is made at step S203 whether or not the current error is less than a predetermined value. While it can be determined that there is some abnormality when the speed of the motor 4 has not increased to the predetermined speed or higher in spite of the second current command for causing the motor 4 to operate, the cause of the abnormality is analyzed on the basis of the magnitude of the current error in the present invention.

When the current error is less than the predetermined value, it is judged at step S204 that an abnormality (the second abnormality) has occurred due to an unconnected power line of the motor 4 or a failure in the amplifier for driving the motor 4.

On the other hand, when the current error is greater than or equal to the predetermined value, it is determined at step S205 that the motor 4 is unable to readily operate because friction (load) or inertia in the machine is significantly high or the rotor is mechanically locked, and it is judged that an abnormality (the third abnormality) has occurred due to friction or inertia in the motor 4 or a mechanical lock of the rotor.

Then, at step S206, the abnormality detection and diagnosis unit 14 sends an abnormality detection signal to the host controller 2 to notify the host controller 2 of the occurrence of the second or third abnormality. Note that the abnormality detection and diagnosis unit 14 may send detailed abnormality information about the second or third abnormality to the host controller 2.

When the abnormality detection and diagnosis unit 14 determines at step S202 that the speed of the motor 4 has increased to the predetermined speed or higher, the abnormality detection and diagnosis unit 14 continues to determine whether another abnormality has occurred or not, as will be described later.

By detecting the second or third abnormality on the basis of the fact that the motor has not operated in accordance with the command when the control for causing the motor to operate has been performed as described above, it can be detected whether there is an abnormality in response to the operation command in the initial operation of the motor. Moreover, distinction between the second and third abnormalities can be made on the basis of the magnitude of the current error, thereby the cause of the abnormality can be accurately detected.

<Method for Detecting Fourth Abnormality>

A method for detecting a fourth abnormality of the motor by the control system of an embodiment of the present invention will now be described. The fourth abnormality is detected on the basis of whether or not the rotor operates in a desired direction of movement when the motor is activated after making sure that the motor properly stops and starts operating in the initial state. By detecting whether there is the fourth abnormality, an abnormality in a component that determines the direction of movement of the motor can be detected.

Figure 4:
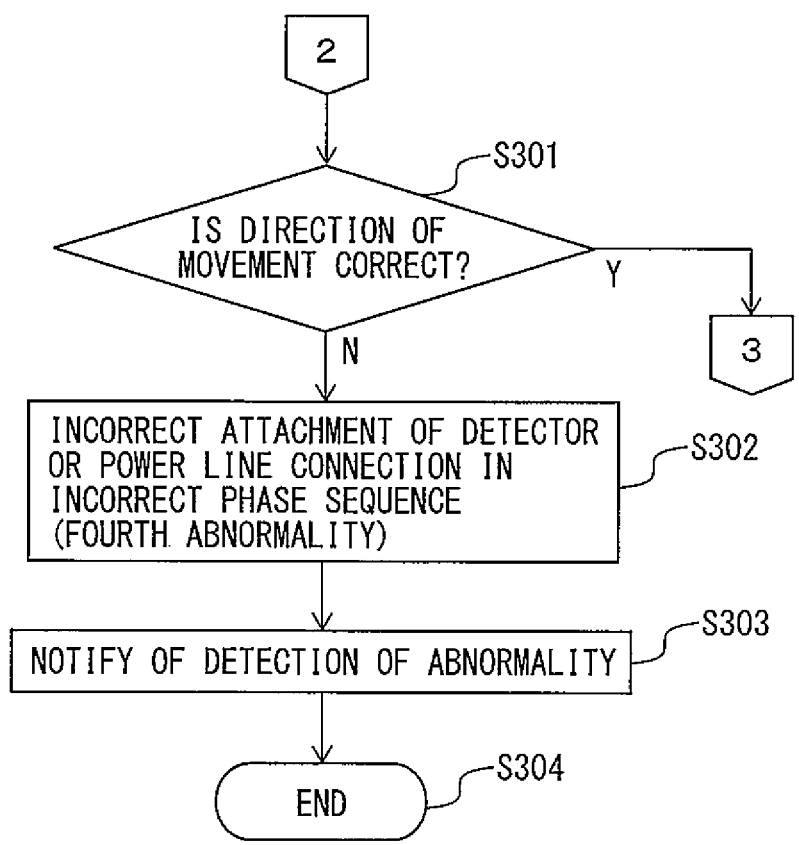
FIG. 4 is a flowchart illustrating a procedure for detecting a fourth abnormality by the control system of an embodiment of the present invention.

FIG. 4 is a flowchart illustrating a procedure for detecting the fourth abnormality of the motor by the control system of an embodiment of the present invention. The flowchart is continued from the flowchart of FIG. 3 and the motor 4 is in the state after the current control unit 11 has provided the second current command to the second excitation phase of the motor 4 over the second period of time at step S201 of FIG. 3.

First, at step S301, determination is made as to whether the rotor of the motor 4 is operating in a desired direction of movement. When the direction of movement of the rotor is incorrect, for example when the direction of movement of the rotor is opposite to a predetermined direction (for example in a direction of 270 degrees), it is judged at step S302 that an incorrect attachment or wiring such as a detector (sensor) being attached in an opposite direction or power lines of the motor being connected in an incorrect phase-sequence, and thus it is judged that an abnormality (the fourth abnormality) has occurred.

Then, at step S303, the abnormality detection and diagnosis unit 14 sends an abnormality detection signal to the host controller 2 to notify the host controller 2 of the occurrence of the fourth abnormality. Note that the abnormality detection and diagnosis unit 14 may send detailed abnormality information about the fourth abnormality to the host controller 2.

When the abnormality detection and diagnosis unit 14 determines at step S301 that the direction of movement of the motor 4 is correct, the abnormality detection and diagnosis unit 14 continues to determine whether another abnormality has occurred or not, as will be described later.

By detecting the fourth abnormality on the basis of the fact that the motor has not operated in the desired direction of movement when control for causing the motor to operate has been performed as described above, it can be detected whether or not there is an abnormality in a component that affects the direction of movement of the motor, such as incorrect attachment of a detector or an improper phase-sequence of power lines.

<Method for Detecting Fifth Abnormality>

A method for detecting a fifth abnormality of the motor by the control system of an embodiment of the present invention will now be described. The fifth abnormality is detected on the basis of whether or not the motor which has been operating stops within a predetermined period of time when the current command is stopped after making sure that the motor in the initial state properly stops and then starts to operate and the rotor operates in a desired direction of movement. By detecting whether there is the fifth abnormality, an abnormality in a load connected to the motor or an incorrect setting of a parameter for driving the motor can be detected.

Figure 5:
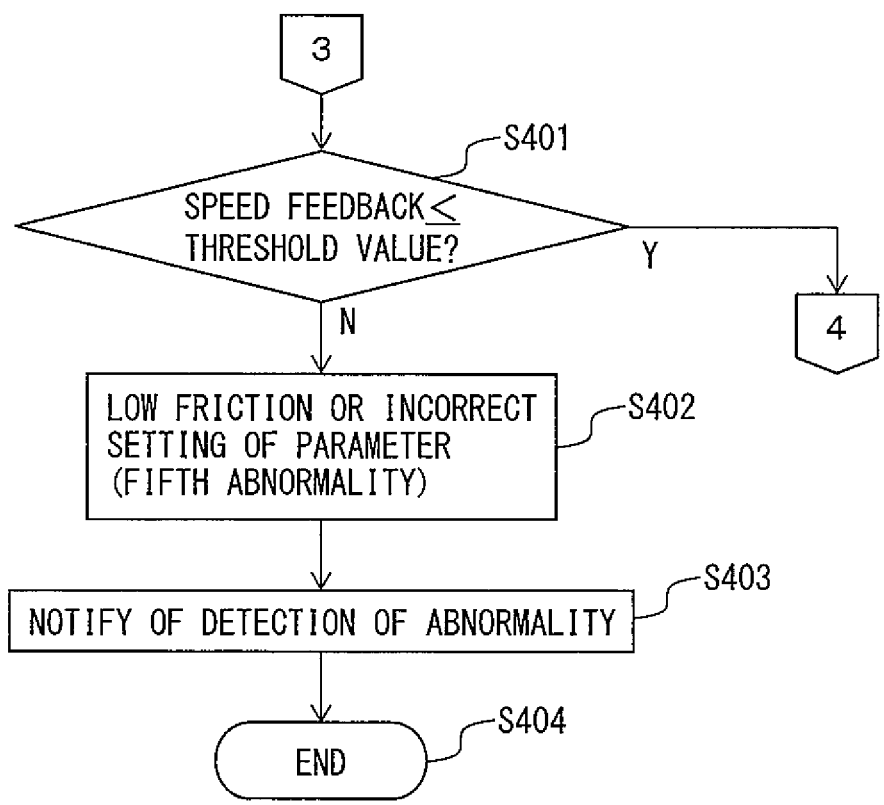
FIG. 5 is a flowchart illustrating a procedure for detecting a fifth abnormality by the control system of an embodiment of the present invention.

FIG. 5 is a flowchart illustrating a procedure for detecting the fifth abnormality in the motor by the control system of an embodiment of the present invention. The flowchart is continued from the flowchart of FIG. 4 and the motor 4 is in the state after the current control unit 11 has provided the second current command to the second excitation phase of the motor 4 over the second period of time at step S201 of FIG. 3. Judgment is made whether or not the motor stops within a predetermined period of time when the current command is stopped.

First, determination is made at step S401 as to whether a speed feedback decreases to a value smaller than or equal to a predetermined threshold value within a predetermined period of time. When the speed feedback does not decrease to a value smaller than or equal to the predetermined threshold value within the predetermined period of time, i.e., when the motor 4 is not placed in a stop state, it is judged at step S402 that friction (load) in the machine is very low or a parameter, such as the number of poles of the motor or the resolution of the angle sensor, which is a prerequisite for calculating the excitation phase from the angle sensor is incorrect and thus it is judged that an abnormality (the fifth abnormality) has occurred.

Then, at step S403, the abnormality detection and diagnosis unit 14 sends an abnormality detection signal to the host controller 2 to notify the host controller 2 of the occurrence of the fifth abnormality. Note that the abnormality detection and diagnosis unit 14 may send detailed abnormality information about the fifth abnormality to the host controller 2.

When it is determined at step S401 that the speed feedback has decreased to a predetermined threshold value or lower within a predetermined period of time, determination is continued as to whether another abnormality has occurred or not, as will be described later.

By determining whether or not the motor stops within a predetermined period of time to detect the fifth abnormality as described above after the control performed for causing the motor to operate to make sure that the motor operates in a desired direction of movement, it can be detected whether there is an abnormality such as significantly low friction (load) in the machine or an incorrect setting of a parameter.

<Method for Detecting Sixth and Seventh Abnormalities>

A method for detecting sixth and seventh abnormalities in the motor by the control system of the present invention will now be described. The sixth and seventh abnormalities are detected on the basis of whether or not the amount of movement from a desired position of the motor in a stop state due to the first excitation to the position of the motor in a stop state due to the second excitation is within a predetermined range after making sure that the motor properly stops in the initial state, moves in a desired direction of movement, and then stops within a predetermined period of time after a current command has been stopped. By detecting whether there is the sixth or the seventh abnormality, an abnormality such as an open phase of a power line or an incorrect setting of a parameter can be detected.

Figure 6:
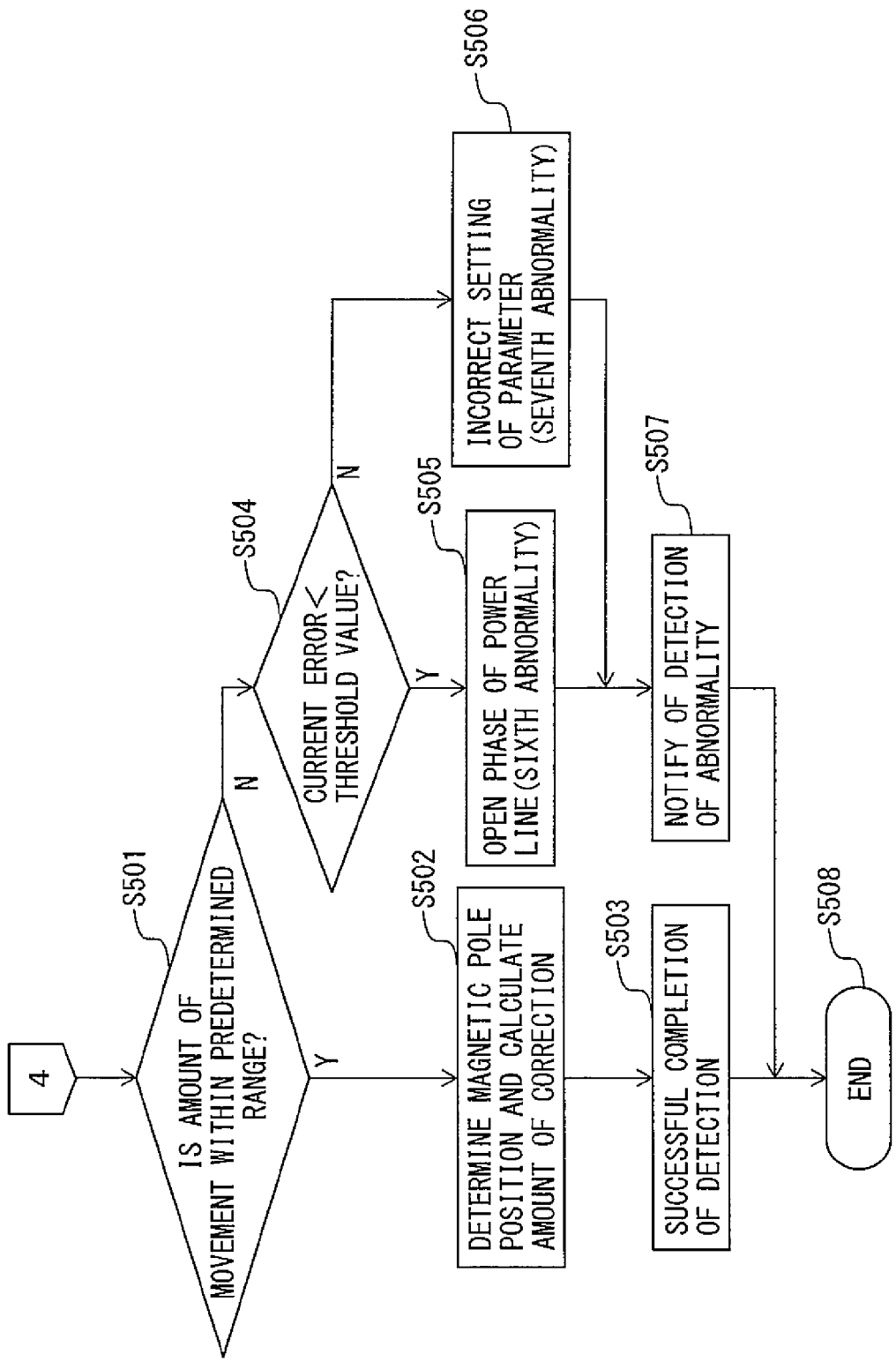
FIG. 6 is a flowchart illustrating a procedure for detecting sixth and seventh abnormalities by the control system of an embodiment of the present invention.

FIG. 6 is a flowchart illustrating a procedure for detecting the sixth and seventh abnormalities in the motor by the control system of an embodiment of the present invention. The flowchart is continued from the flowchart of FIG. 5 and the motor has been stopped within the predetermined period of time.

First, at step S501, determination is made as to whether the amount of movement from the position at which the rotor stopped due to the first excitation to the position at which the rotor stopped due to the second excitation is within a predetermined range (for example an amount of movement of ±10 degrees from a desired position of 90 degrees).

When the amount of movement of the rotor is not within the predetermined range, determination is made at step S504 as to whether or not the current error is less than a predetermined threshold value.

When the current error is less than the predetermined threshold value, it is judged at step S505 that there is an open phase (poor connection) of a power line and thus it is judged that an abnormality (the sixth abnormality) has occurred.

On the other hand, when the current error is greater than or equal to the predetermined threshold value, it is judged at step S506 that a parameter which is a prerequisite for calculating an excitation phase from the angle sensor, such as the number of poles of the motor or the resolution of the angle sensor is incorrect and thus it is judged that an abnormality (the seventh abnormality) has occurred.

Then, at step S507, the abnormality detection and diagnosis unit 14 sends an abnormality detection signal to the host controller 2 to notify the host controller 2 of the occurrence of the sixth or seventh abnormality. Note that the abnormality detection and diagnosis unit 14 may send detailed abnormality information about the sixth or seventh abnormality to the host controller 2.

When it is determined at step S501 that the amount of movement from the position at which the rotor stopped due to the first excitation to the position at which the rotor stopped due to the second excitation is within the predetermined range, it is ultimately judged that none of the first to seventh abnormalities has been detected and it is determined at step S502 that the position at which the rotor stopped is the magnetic pole position. In this case, an excitation phase calculated from the angle sensor is corrected so that current is controlled so as to be orthogonal to the magnetic pole position. Then, it is judged at step S503 that the abnormality detection has been successfully completed.

By detecting the sixth or seventh abnormality on the basis of the fact that the amount of movement of the rotor is not within the predetermined range after performing a control to cause the motor to operate to make sure that the motor operates in the desired direction of movement and then stopping the motor as described above, it can be detected whether there is an abnormality such as an open phase of a power line or an incorrect setting of a parameter.

As has been described above, the control system according to an embodiment of the present invention is capable of detecting an abnormality during the initial start-up of the motor by detecting whether or not there is any of the first to seventh abnormalities. Furthermore, the control system is capable of detecting an abnormality due to a fault such as an incorrect connection of a power line of the motor or an incorrect setting of a parameter such as the number of motor poles of the motor on the basis of detailed information about any of the first to seventh abnormalities, thereby allowing the user to quickly take a corrective action for the abnormality.

What is claimed is:

1. A control system for a synchronous motor with an abnormality detection and diagnosis function, the control system comprising:

a current control unit providing, in detection of a magnetic pole position of a rotor of a motor during the initial start-up of the motor in which permanent magnets are disposed, a first current command to a first excitation phase of a stator winding of the motor over a first period of time when the motor is to be stopped and providing a second current command to a second excitation phase different from the first excitation phase over a second period of time when the motor is to be caused to operate;

a magnetic pole position detector correcting an excitation phase on the basis of a magnetic pole position of the stopped motor;

a current error calculator calculating a current error, the current error being a difference between a current flowing through the motor in the second period of time and the second current command; and an abnormality detection and diagnosis unit detecting an abnormality on the basis of
  a speed of the motor in the first period of time, and
  the speed of the motor, the direction of movement and the amount of movement of the motor, and the magnitude of the current error in the second period of time, wherein when the speed of the motor is higher than a predetermined speed while the first current command is provided to the first excitation phase of the motor over the first period of time, the abnormality detection and diagnosis unit judges that a first abnormality has occurred in a current feedback from the motor to the current control unit or in a speed feedback from the motor to the abnormality detection and diagnosis unit.

2. The control system according to claim 1,
wherein when the speed of the motor is lower than the predetermined speed and the current error is less than a predetermined value while the current control unit provides the second current command to the second excitation phase of the motor over the second period of time,
  the abnormality detection and diagnosis unit judges that a second abnormality has occurred due to an unconnected power line of the motor or a failure in an amplifier for driving the motor; and when the speed of the motor is lower than the predetermined speed and the current error is greater than or equal to the predetermined value while the current control unit provides the second current command to the second excitation phase of the motor over the second period of time,
  the abnormality detection and diagnosis unit judges that a third abnormality has occurred due to friction or inertia in the motor or a mechanical lock of the rotor.

3. The control system according to claim 2,
wherein when the speed of the motor increases to be equal to or higher than the predetermined speed and the rotor of the motor does not move in a predetermined direction while the current control unit provides the second current command to the second excitation phase of the motor over the second period of time,
  the abnormality detection and diagnosis unit determines that a fourth abnormality has occurred due to an incorrect mounting of a sensor for detection of the magnetic pole position of the rotor or connection of power lines of the motor in an incorrect phase sequence.

4. The control system according to claim 3,
wherein when
  the speed of the motor increases to be equal to or higher than the predetermined speed, and the rotor of the motor moves in the predetermined direction while the current control unit provides the second current command to the second excitation phase of the motor over the second period of time, and
  the speed of the motor, after stopping the second current command, remains higher than a predetermined threshold value within a predetermined period of time,
    the abnormality detection and diagnosis unit judges that a fifth abnormality has occurred due to friction in the motor or an incorrect setting of a parameter required for calculating an excitation phase from a measured value from an angle sensor of the motor.

5. The control system according to claim 4,
wherein when
  the speed of the motor increases to be equal to or higher than the predetermined speed, and the rotor of the motor moves in the predetermined direction while the current control unit provides the second current command to the second excitation phase of the motor over the second period of time,
  the speed of the motor, after stopping the second current command, decreases to be equal to or lower than the predetermined threshold value within the predetermined period of time, and
  the amount of movement of the motor is not within a predetermined range, and the current error is less than threshold value while the current control unit provides the second current command to the second excitation phase of the motor over the second period of time,
    the abnormality detection and diagnosis unit judges that a sixth abnormality has occurred due to a poor connection of a power line; and when
  the speed of the motor increases to be equal to or higher than the predetermined speed and the rotor of the motor moves in the predetermined direction while the current control unit provides the second current command to the second excitation phase of the motor over the second period of time,
  the speed of the motor, after stopping the second current command, decreases to be equal to or lower than the predetermined threshold value within the predetermined period of time, and
  the amount of movement of the motor is not within the predetermined range and the current error is greater than or equal to the threshold value while the current control unit provides the second current command to the second excitation phase of the motor over the second period of time,
    the abnormality detection and diagnosis unit judges that a seventh abnormality has occurred due to an incorrect setting of a parameter required for calculating an excitation phase from a measured value from an angle sensor of the motor.

6. The control system according to claim 5, wherein when the abnormality detection and diagnosis unit judges that any abnormality among the first to seventh abnormalities has occurred, the abnormality detection and diagnosis unit notifies a host controller of the abnormality that has occurred.

* * * * *